United States Patent [19]

Liu

[11] Patent Number: 5,646,421

[45] Date of Patent: Jul. 8, 1997

[54] MULTICOLOR VOLTAGE TUNABLE QUANTUM WELL INTERSUBBAND INFRARED PHOTODETECTOR

[76] Inventor: Hui Chun Liu, 1400 Turner Crescent, Orleans Ontario, Canada, K1E 2Y4

[21] Appl. No.: 735,314

[22] Filed: Oct. 25, 1996

Related U.S. Application Data

[63] Continuation of Ser. No. 327,699, Oct. 24, 1994, abandoned, which is a continuation of Ser. No. 101,532, Jul. 16, 1993, abandoned.

[51] Int. Cl.$^6$ ............................................. H01L 29/06
[52] U.S. Cl. .................. 257/21; 257/17; 257/22; 257/184; 257/440
[58] Field of Search ........................ 257/21, 22, 184, 257/189, 440, 14, 17, 23, 185

[56] References Cited

U.S. PATENT DOCUMENTS

| | | | |
|---|---|---|---|
| 5,077,593 | 12/1991 | Sato et al. | 257/71 |
| 5,285,080 | 2/1994 | Abe et al. | 257/184 |

OTHER PUBLICATIONS

Whitehead et al., "Effects of well width on the characteristics of GsSs/AlGaAs multiple quantum well elctroabsorption modulators", Appl. Phys. Lett. 53(11), 956–95 Sep. 1988.

Primary Examiner—Jerome Jackson
Assistant Examiner—Nathan K. Kelley
Attorney, Agent, or Firm—Neil Teitelbaum & Associates

[57] ABSTRACT

A quantum well intersubband infrared (IR) photodetector has a spectral response tunable by an external voltage. The photodetector consists of multiple doped quantum wells with different well widths and barrier heights. The preferred embodiment is made by repeating the whole structure of the active region of a multiple quantum well intersubband IR photodetector. Differences between repeats or groups of well widths and barrier heights result in differences in the spectral IR response of the different repeats. The device resistance of a given group is designed to be very different from those for all the other groups. As a function of an applied voltage, the repeat with the highest resistance will be turned on to detect IR with the response peak at a wavelength $\lambda_1$. Subsequently, the next highest resistance repeat will turn on when increasing voltage with its response peaked at $\lambda_2$, and so on. Since $\lambda_1$, $\lambda_2$ are different from each other, a voltage tunable multicolor photodetector is realized.

13 Claims, 3 Drawing Sheets

MULTICOLOR VOLTAGE TUNABLE QUANTUM WELL INTERSUBBAND INFRARED PHOTODETECTOR

This application is a continuation of application Ser. No. 08/327,699, filed Oct. 24, 1994, now abandoned, which is a continuation of application Ser. No. 08/101,532,filed Jul. 16, 1993, now abandoned.

FIELD OF THE INVENTION

The present invention relates generally to photodetectors and more particularly to a multicolour infrared (IR) photodetector

BACKGROUND OF THE INVENTION

Infrared remote control and sensing technology infrared fiber optics for communication and are two important technological areas in modern electronics. In these applications, a sensitive and fast infrared (IR) detector is the most important element in the system.

Methods for making quantum well IR detectors are well known. In U.S. Pat. No. 4,873,555 entitled "Intraband Quantum Well Photodetector and Associated Method", issued Oct. 10, 1989, in the name of Coon et al., the applicant teaches a basic method for making a single-well detector and introduces the use of intraband or intersubband transitions for IR detection. Subsequently, a multiple quantum well (MQW) detector was disclosed by Bethea et al. in U.S. Pat. No. 4,894,526 entitled "Infrared Radiation Detector Device", issued Jan. 16, 1990. These detectors however, were limited having a fixed spectral response curve. Kwong-Kit Choi, in U.S. Pat. No. 5,013,918 entitled "Multicolour Infrared Photodetector discloses a multicolour detector based on coupled quantum wells; Choi's detector is comprised of units of thick and thin wells separated by a thin barrier. A thick quantum well having two confined states $E_1$ and $E_2$ and thin quantum well having one confined state $E_1$ are brought close enough together so that the wells become coupled and the level structure becomes common to both wells. However, a physical limit of the thickness of the thin barrier constrains the range of the spectrum tuning range that Choi's device can detect.

SUMMARY OF THE INVENTION

It is an object of the invention to provide a detector which can efficiently detect signals having a plurality of frequencies defining a spectrum of colours. It is a further object of the invention, to provide a multicolour photodetector which is small, compact, and which takes up little space.

In accordance with the invention there is provided, a detector comprising a substrate supported heterostructure including semiconductor layers comprising at least a first and second quantum wells doped for differing conductivity type. The first and second quantum wells are separated by a doped conducting layer. Each quantum well has its first excited state close to the top of the barrier, which permits an efficient escape of photo excited carriers. Subsequent transport of the carriers are at energies above the barrier top energy. The detector includes contact means for electrically biasing the heterostructure and for sensing an electrical signal in response to radiation incident on said heterostructure.

In accordance with the invention, there is further provided, a multi-colour detector comprising a plurality layers. The layers define quantum well groups wherein each group has at least one quantum well. Quantum wells within a group are of like conductivity, wherein at least quantum wells of some groups are of different conductivity. The quantum well groups are spaced apart by a doped conducting layer and have outer conducting means for biasing the detector and for sensing an electrical signal in response to radiation incident on the detector.

In accordance with the invention, a device is provided, which comprises a plurality of serially connected groups of quantum wells. Each group of wells has a different resistance and each group is sensitive to a signal having a different wavelength.

BRIEF DESCRIPTION OF THE DRAWINGS

Exemplary embodiments of the invention will be described in conjunction with the drawings in which:

FIG. 1a is an illustrative representation of a band edge profile of a 3-colour detector with $MQW_1$ switched on;

FIG. 1b is an illustrative representation of a band edge profile of the 3-colour detector of FIG. 1a with $MQW_2$ switched on;

FIG. 1c is an illustrative representation of a band edge profile of the 3-colour detector of FIG. 1a with $MQW_3$ switched on;

DETAILED DESCRIPTION

In a conventional quantum well IR detector, and for a given detection spectral peak position, the detector current depends exponentially on the photon energy of the response peak. Therefore, detectors with different peak spectral responses will have exponentially different device currents. Furthermore, the device current increases and the device resistance decreases, both exponentially, with applied bias voltage.

In accordance the invention, it has been found, that if one connects two detectors in series, with tuned at wavelengths $\lambda_1$ and $\lambda_2$ respectively, ($\lambda_1 < \lambda_2$) and applies a bias voltage, the $\lambda_1$-detector will have most of the bias voltage dropped across it at low voltages, and this serially connected detector assembly will only act as a detector peaked at $\lambda_1$, i.e., a one colour detector. However, when the bias voltage is further increased, the device resistance of the detector tuned to $\lambda_1$, rapidly decreases; an increased fraction of the applied voltage is dropped across the $\lambda_2$ detector and the serially connected detector assembly will act as a two colour detector having both $\lambda_1$ and $\lambda_2$ responses. Of course, this can be easily extended to a plurality of detectors connected in series. However, where space is at a premium, externally connecting two discrete detectors in series may not be practical, as it is nearly impossible to position both detectors at the same spatial point.

With the advent of modern atomically controlled epitaxial growth techniques, serially connecting detectors proximate to one another can be easily accomplished, with the "connecting" leads being a heavily doped conducting layer. To reduce the unwanted free carrier absorption, these connecting layers should be thin but also must be thick enough to be able to accommodate the electric field change between two different wavelength detector structures. With multicolour detector stacks of quantum wells separated by connecting layers at the same spatial position, with respect to a received signal, the individual detector structures, each responsive to different wavelengths, can be switched on one at a time.

Figure 2:
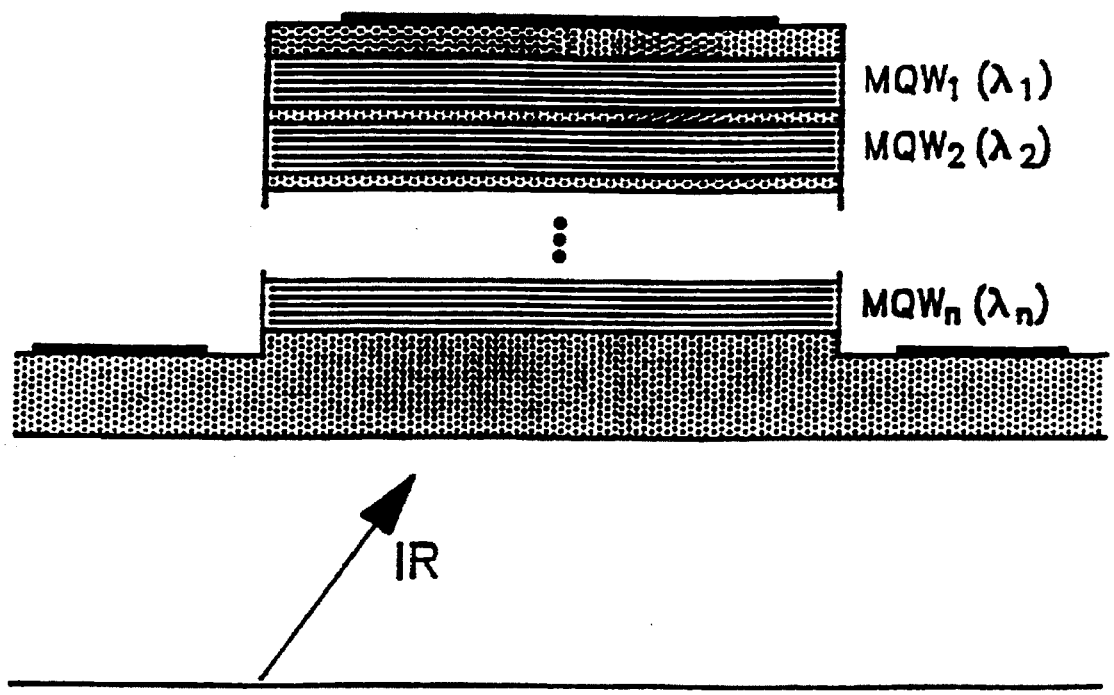
FIG. 2 is a cross sectional view of a mesa structure of an n-colour detector; and, FIG. 3 is a circuit diagram of a model of an equivalent circuit of a 3-colour detector biased through a series load resistor.

The detector in accordance with the invention shown in FIG. 2, may be fabricated from a variety of materials such as n or p-type GaAs-AlGaAs, p-type Si-SiGe, n- or p-type InGaAs-AlGaAs, n- or p-type InGaAs-InP, and others.

The basic design of quantum wells for an infrared detector is described by the applicant in U.S. Pat. No. 4,874,555 issued Oct. 10, 1989, entitled "Intraband Quantum Well Photodetector and Associated Method. The design of a high performance detector is described by the applicant in Superlatt. Microstruct. 4, 343 (1988) and in J. Appl. Phys. 73, 3062. The design as described in this article teaches the use of a GaAs doped with Si as the well material and $Al_xGa_{1-x}As$ with or without doping as the barrier material, where $0<x\leq 1$. Cladding a well material with two barrier layers on either sides, makes a quantum well (QW), and repeating this quantum well sequentially, makes a multiple quantum well (MQW). The well width and the barrier height(with the latter being determined by the Al alloy fraction, x) are chosen so that the QW confines either one or two quantum mechanical eigenstates, in the formal case the second or upper eigenstate had just been pushed out of the QW, i.e., if one increased the well width slightly (e.g., by 0.3 nm) one would have had a two eigenstate situation, whereas in the latter case the upper eigenstate should be very close to the top of the barrier (e.g. with a difference in energy less then 20 meV). Finally, the MQW is clad by two conducting or heavily doped GaAs layers for making electrical contacts. Based on these references and the description of the present invention, it is within the capability of those skilled in the art to design an N-colour infrared detector. Based on these references and the description of the present invention, it is within the capability of those skilled in the art to design an N-colour infrared detector.

By way of example, in one embodiment, a three-colour detector with individual MQW structures having $\lambda_1=8.7$ μm, $\lambda_2=10.4$ μm, and $\lambda_3=12.1$ μm, respectively is described. For $MQW_1$ (having $\lambda_1$ peak response), the well is 5.9 nm GaAs and is doped with Si to about $5\times 10^{11}$ cm$^{-2}$; the barrier is 50.0 nm undoped $Al_{0.26}Ga_{0.74}As$. For $MQW_2$, the well is 6.5 nm GaAs and is doped with Si to about $5\times 10^{11}$ cm$^{-2}$; the barrier is 50.0 nm undoped $Al_{0.22}Ga_{0.78}As$. For $MQW_3$, the well is 7.1 nm GaAs and is doped with Si to about $5\times 10^{11}$ cm$^{-2}$, and the barrier is 50.0 nm undoped $Al_{0.19}Ga_{0.81}As$. For all the MQWs, the number of wells should be greater than about 20 for high absorption. The larger the number of wells, the lower the detector noise. In one embodiment, 32 wells were used however, 20 to 100 wells were found to be practicable. The separation between MQWs, and the top and the bottom contact layers are doped with Si to about $1.5\times 10^{18}$ cm$^{-3}$ having thicknesses of 100.0 nm, 0.4μm, and 1.01 μm, respectively. The substrate for epitaxial growth is semi-insulating (100) GaAs.

Figure 1A:
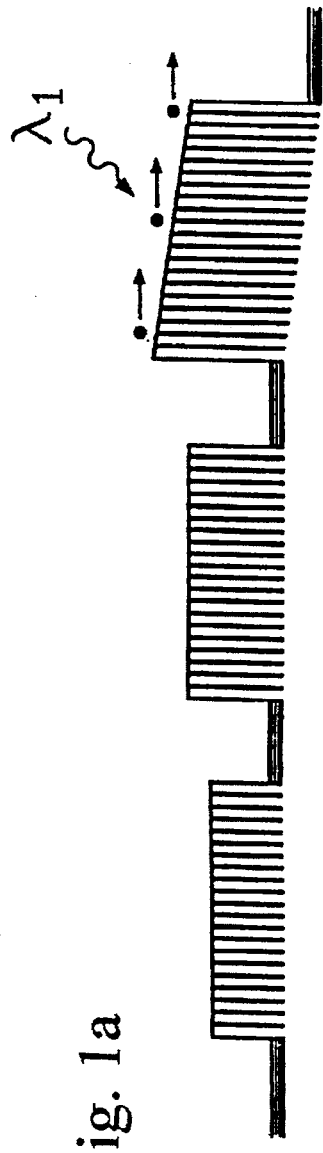
Figure 1B:
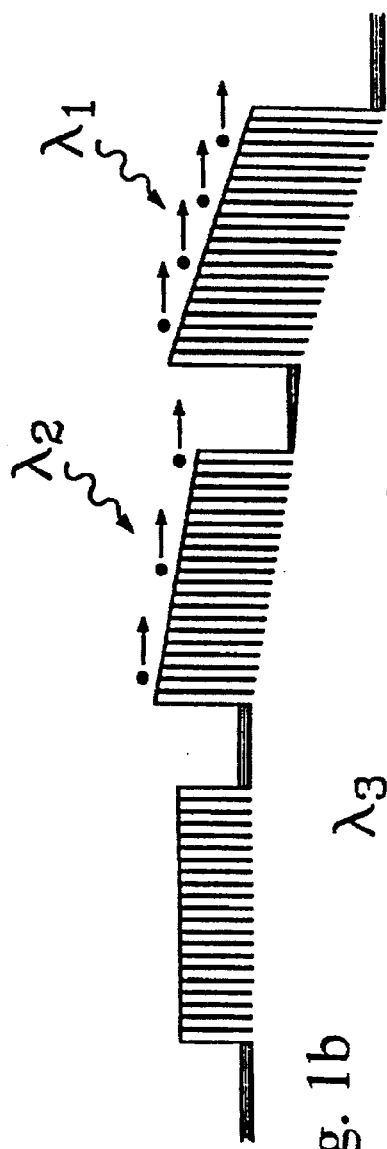
Figure 1C:
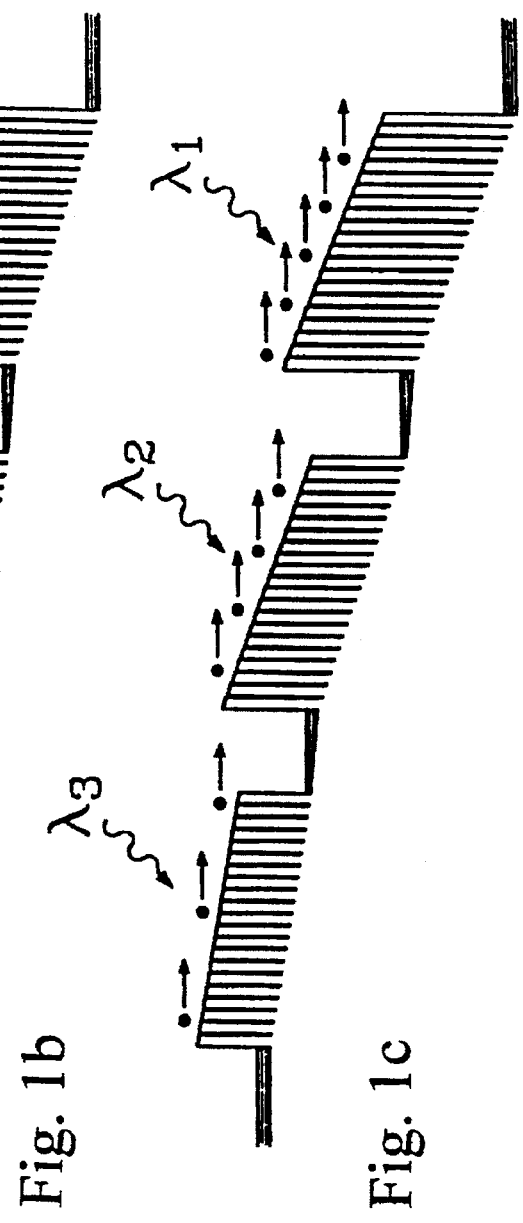

FIGS. 1a, 1b, and 1c show schematically the band edge profile of an N-colour, (by way of example, N=3) detector under different bias voltages. As shown in FIG. 1a, $MQW_1$ turns on at a low voltage $V_1$. In FIG. 1b $MQW_2$ turns on at an intermediate voltage $V_2$, and in FIG. 1c, $MQW_3$ turns on at a high voltage $V_3$. The wavelengths at the peak response are $\lambda_1$, $\lambda_2$, and $\lambda_3$, respectively. When $V_1$ is applied to the detector, and in the presence of incident light of wavelength $\lambda_1$ electrons shown above one group flow in the direction of the arrow shown. On the other hand, as illustrated in FIG. 1b, when the detector is biased by an input voltage $V_2$ which is greater than $V_1$, electrons flow from two groups of MQWs. Since the resistance of the groups of MQWs is dynamic, when $V_2$ is applied, a substantial fraction of the voltage drop is across $MQW_2$, and most of the current generated by the device corresponds to detected incident light having a wavelength $\lambda_2$. As the resistance of $MQW_1$ lessens, current generated by it also lessens. In this manner, the device in accordance with the invention, functions as a N-colour detector capable of detecting light having a plurality of wavelengths. Advantageously, the device also provides an electrical output signal which corresponds to one of N-colours thereby performing the function of a spectrometer having no moving parts.

Figure 3:
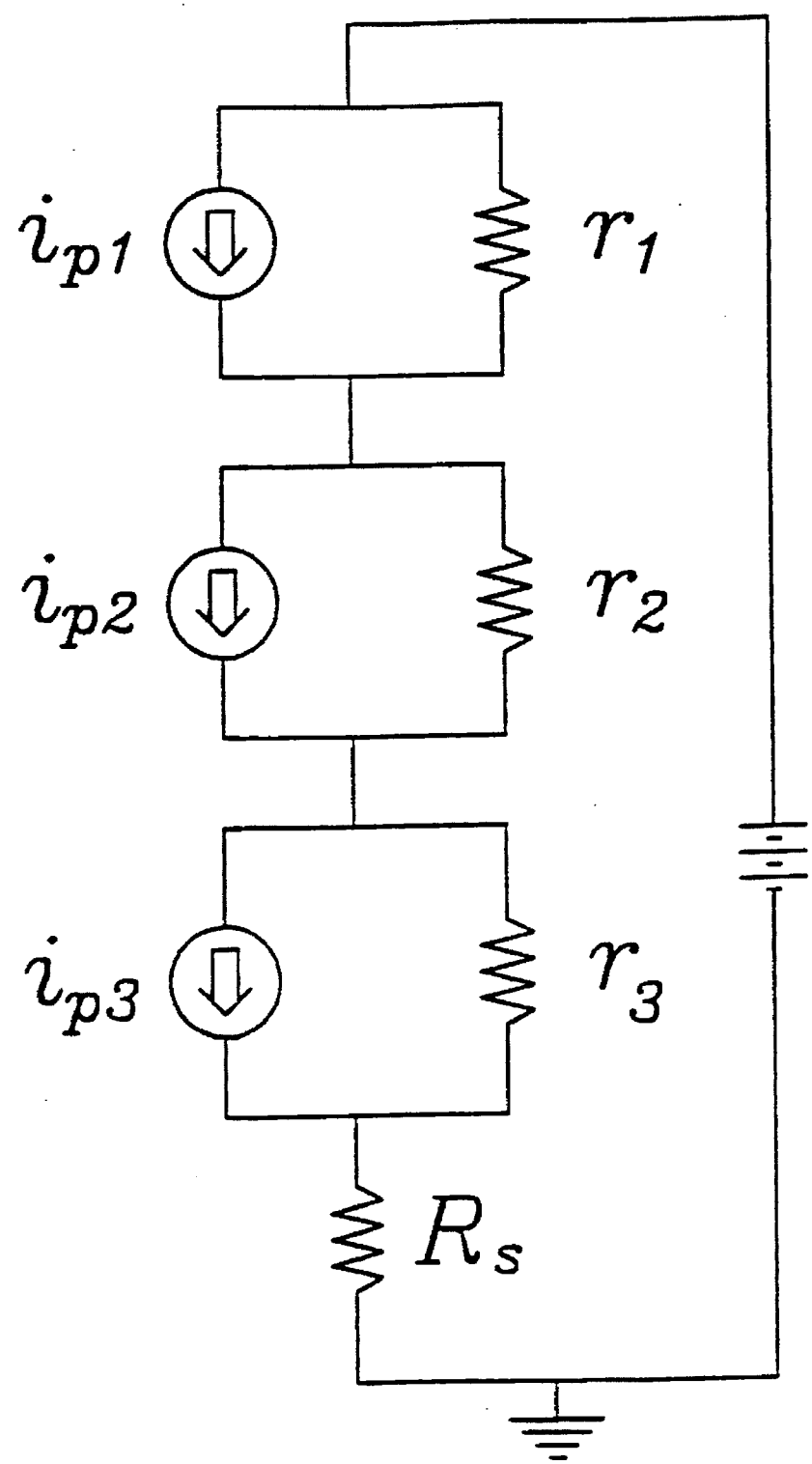

Referring to FIG. 2 a device mesa structure of the N-colour detector is shown, having IR light coupled into the device from the back at an angle. When using an IR detector of photoconductive type, in practice, a typical configuration includes applying a constant dc bias across detector in series with a load resistor $R_S$. The equivalent circuit of a 3-colour detector comprises a network of photocurrent sources $i_{p1}$, $i_{p2}$, and $i_{p3}$ and dynamic device resistances $r_1$, $r_2$, and $r_3$ as shown in FIG. 3. The measured photocurrent, defined as the measured voltage change across the load resistor divided by the resistance value is $$i_{photo} = \frac{i_{p1}r_1 + i_{p2}r_2 + i_{p3}r_3}{R_S + r_1 + r_2 + r_3} \quad (1)$$

The non-linear nature of the dynamic resistances as a function of the voltage provides to a non-linear weighting factor of the relative contributions among $i_{p1}$, $i_{p2}$, and $i_{p3}$ to $i_{photo}$. For example, if the dynamic resistance of $r_1$ changes in such a manner as its value becomes much less than $r_2$ at the intermediate voltage $V_2$, the response of the $\lambda_1$ peak would be reduced relative to the $\lambda_2$ peak.

In the example above, N=3, however an N-colour where N>3 can be designed in a similar manner by increasing the number of well groups. Preferably each quantum well in a group of quantum wells is to be of like conductivity. For a device sensitive to N colours, N well groups having a different conductivity value are required; therefore the device resistance of a given well group is designed to be different from those for all the other well groups.

Numerous other embodiments may be envisaged without departing from the spirit and scope of the invention.

What I claim is:

1. A mid and far infrared multi-colour unipolar detector comprising:

a substrate supported integrated heterostructure including:

semiconductor layers comprising at least a first and second serially connected quantum wells, the at least first and second quantum wells having differing conductivity values, the at least first and second quantum wells including a dopant that consists of a single type, either n-type or p- type, the first and second quantum wells separated by a doped conducting layer, and contact means for electrically biasing the heterostructure and for sensing an electrical signal in response to radiation incident on said heterostructure.

2. A mid and far infrared multi-colour unipolar detector comprising:

a plurality of layers forming an integrated structure and defining a plurality of groups of serially connected quantum wells doped exclusively with n-type or p-type dopant each group having at least one quantum well, quantum wells within a group having substantially the same conductivity value, wherein at least quantum wells of one group are of a different conductivity value than quantum wells of another group, each quantum well group being spaced apart by a doped conducting layer, and outer conducting means coupled to each of the groups of quantum wells for serially connecting the groups of quantum wells, biasing the detector and for sensing an electrical signal in response to radiation incident on the detector.

3. The mid and far infrared multi-colour unipolar detector of claim 2 wherein barrier heights and well widths are different between different quantum well groups.

4. The mid and far infrared multi-colour unipolar detector of claim 3 wherein the plurality of groups of serially connected quantum wells are formed of $Al_xGa_{1-x}As$, wherein $y \leq 1$.

5. The mid and far infrared multi-colour unipolar detector of claim 3, wherein barriers within a group of quantum wells are identical and are formed of $Al_xGa_{1-x}As$ with $x>0$, and wherein well layers within a group of serially connected quantum wells are identical and are formed of $Al_yGa_{1-y}As$, wherein $y<x$.

6. The mid and far infrared multi-colour unipolar detector of claim 5 wherein the dopant comprises the dopant Si.

7. A mid and far infrared multi-colour unipolar detector comprising:

a semiconductor substrate;

a first conductive layer formed on said semiconductor substrate;

a first group of semiconductor layers formed on first conductive layer, said first group of semiconductor layers comprising a plurality of quantum wells having a first conductivity value, each quantum well of said first group of semiconductor layers comprising:
a first barrier layer;
a first semiconductor layer, formed atop the first barrier layer and doped with an impurity, and
a second barrier layer, formed atop the first semiconductor layer;

a second conductive layer formed on said first group of semiconductor layers, for conducting current from said first conductive layer through said first group of semiconductor layers;

a second group of semiconductor layers formed on said second conductive layer, said second group of layers comprising a plurality of quantum wells having a second conductivity value different from the first conductivity value, each quantum well of said second group of semiconductor layers comprising:

a third barrier layer;
a second semiconductor layer, formed atop the third barrier layer and doped with the impurity, and
a fourth barrier layer, formed atop the second semiconductor layer; and a third conductive layer, formed on said second group of semiconductor layers, for conducting current from said first conductive layer through said first and second groups of semiconductor layers;

wherein infrared light may be passed through the semiconductor substrate, said first conductive layer, said first group of semiconductor layers, said second conductive layer, and said second group of semiconductor layers and said plurality of quantum wells having a first conductivity value output a signal proportional to a first wavelength of infrared light and said plurality of quantum wells having a second conductivity value output a signal proportional to a second wavelength of infrared light.

8. The mid and far infrared multi-color unipolar detector of claim 7, wherein barrier heights and well widths of said plurality of quantum wells having a first conductivity value and said plurality of quantum wells having a second conductivity value are different from one another.

9. The mid and far infrared multi-color unipolar detector of claim 8, wherein said first and second semiconductor layers are formed of $Al_xGa_{1-x}As$, wherein $x \leq 1$.

10. The mid and far infrared multi-color unipolar detector of claim 9, wherein barrier layers within a group of quantum wells are identical and are formed of $Al_xGa_{1-x}As$ with $x>0$, and wherein semiconductor layers within a group of serially connected quantum wells are identical and are formed of $Al_yGa_{1-y}As$, wherein $y<x$.

11. The mid and far infrared multi-color unipolar detector of claim 7, wherein each of said quantum wells is doped with the dopant Si.

12. The mid and far infrared multi-color unipolar detector of claim 7, wherein said plurality of quantum wells having a first conductivity value has a first well width and said plurality of quantum wells having a second conductivity value has a second well width different from the first well width.

13. The mid and far infrared multi-color unipolar detector of claim 7, wherein said plurality of quantum wells having a first conductivity value has a first barrier height and said plurality of quantum wells having a second conductivity value has a second barrier height different from the first barrier height.

* * * * *